United States Patent
You

(10) Patent No.: US 8,347,042 B2
(45) Date of Patent: Jan. 1, 2013

(54) MULTI-PLANE TYPE FLASH MEMORY AND METHODS OF CONTROLLING PROGRAM AND READ OPERATIONS THEREOF

(75) Inventor: Byoung Sung You, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 206 days.

(21) Appl. No.: 12/474,036

(22) Filed: May 28, 2009

(65) Prior Publication Data
US 2009/0238005 A1 Sep. 24, 2009

Related U.S. Application Data

(63) Continuation of application No. 11/159,542, filed on Jun. 22, 2005, now abandoned.

(30) Foreign Application Priority Data

Mar. 10, 2005 (KR) ........................ 10-2005-0020169

(51) Int. Cl.
*G06F 13/00* (2006.01)
*G06F 13/28* (2006.01)
*G11C 7/00* (2006.01)
*G11C 7/18* (2006.01)
*G11C 8/00* (2006.01)

(52) U.S. Cl. ................. 711/144; 711/103; 711/E12.008; 365/185.18; 365/230.06; 365/185.33

(58) Field of Classification Search .................. 711/127, 711/155, 157
See application file for complete search history.

(56) References Cited

U.S. PATENT DOCUMENTS

| | | | |
|---|---|---|---|
| 5,768,584 | A | 6/1998 | MacDonald et al. |
| 6,101,198 | A | 8/2000 | Koenig et al. |
| 6,195,106 | B1 | 2/2001 | Deering et al. |
| 6,240,040 | B1 | 5/2001 | Akaogi et al. |
| 6,385,688 | B1 | 5/2002 | Mills et al. |
| 6,735,727 | B1 | 5/2004 | Lee |
| 2003/0117851 | A1 | 6/2003 | Lee et al. |

(Continued)

FOREIGN PATENT DOCUMENTS

JP 07-311708 11/1995

(Continued)

*Primary Examiner* — Kevin Verbrugge
*Assistant Examiner* — Eric S Cardwell
(74) *Attorney, Agent, or Firm* — Kilpatrick Townsend & Stockton LLP

(57) ABSTRACT

A multi-plane type flash memory device comprises a plurality of planes each including a plurality of memory cell blocks, page buffers each latching an input data bit to be output to its corresponding plane or latching an output data bit to be received from the corresponding plane, cache buffers each storing an input or output data bits in response to one of cache input control signals and each transferring the stored data bit to the page buffer or an external device in response to one of cache output control signals, and a control logic circuit generating the cache input and output control signals in response to command and chip enable signals containing plural bits. The program and read operations for the plural planes are conducted simultaneously in response to the chip enable signal containing the plural bits, which increases an operation speed and data throughput processed therein.

21 Claims, 6 Drawing Sheets

| U.S. PATENT DOCUMENTS | | | FOREIGN PATENT DOCUMENTS | | |
|---|---|---|---|---|---|
| 2003/0169621 A1 | 9/2003 | Kawamura | JP | 2001-167586 | 6/2001 |
| 2003/0198084 A1 | 10/2003 | Fujisawa et al. | KR | 10-1999-0065224 | 5/1999 |
| 2004/0174727 A1 | 9/2004 | Park | KR | 100223614 B1 | 10/1999 |
| 2005/0172086 A1 | 8/2005 | Kawai | KR | 10-2002-0091932 A | 12/2002 |
| 2005/0180337 A1 | 8/2005 | Roemerman et al. | KR | 10-2003-0054076 A | 7/2003 |
| 2006/0044874 A1 | 3/2006 | Tokiwa | WO | WO03085676 A1 | 10/2003 |

MULTI-PLANE TYPE FLASH MEMORY AND METHODS OF CONTROLLING PROGRAM AND READ OPERATIONS THEREOF

CROSS-REFERENCES TO RELATED APPLICATIONS

The present application is a continuation of U.S. patent application Ser. No. 11/159,542, filed Jun. 22, 2005, which claims priority to Korean Patent Application No. 10-2005-0020169, filed Mar. 10, 2005, both of which are incorporated by reference.

BACKGROUND OF THE INVENTION

The present invention relates to flash memory devices and specifically, to a multi-plane type flash memory device and method of controlling program and read operations thereof.

Flash memory devices may be generally classified into single-plane types and multi-plane types in accordance with the structural configuration of memory cell array thereof. The single-plane type flash memory device includes a single plane composed of a plurality of memory cell blocks, while the multi-plane type flash memory device includes a plurality of planes each being composed of a plurality of memory cell blocks. FIG. 1 is a block diagram of a conventional flash memory device, showing the single-plane type flash memory device. Referring to FIG. 1, the flash memory device 10 has an input buffer 11, a control logic circuit 12, a high voltage generator 13, memory cell blocks B1~BK, an X-decoder 14, a Y-decoder 16, and a data input/output circuit 17. Referring to FIG. 2, it will be described about a program operation of the flash memory device shown in FIG. 1. FIG. 2 is a timing diagram relevant to a program operation of the flash memory device shown in FIG. 1. First, a chip enable signal CEb is disabled and a write enable signal Web is toggled. Responding to the chip enable signal CEb and the write enable signal Web, the control logic circuit 12 receives a command signal CMD1 and an address signal ADD that are successively applied through the input buffer 11, and then generates a program command PGM, a row address signal RADD, and a column address signal CADD. While this, the command signal CMD1 contains a page program setup code determining an operation mode of the flash memory device 10, and the address signal ADD corresponds to one of the pages included in one of the memory cell blocks B1~BK.

The high voltage generator 13 generates bias voltages in response to the program command PGM and the X-decoder 14 supplies the bias voltage to one of the memory cell blocks B1~BK in response to the row address signal RADD. The page buffer 15 latches a data signal D1 received through the data input/output circuit 17 and the Y-decoder 16 and transfers the data signals D1 to bitlines (not shown) shared by the memory cell blocks B1~BK. After then, the control logic circuit 12 receives another command signal CMD2 and disables a ready/busy signal R/Bb for a predetermined time T. The command signal CMD2 contains a confirmation code for instructing the flash memory to start a program operation therein. An external controller (not shown) receives the ready/busy signal R/Bb and identifies the flash memory device in the state of a program operation. In other words, while the ready/busy signal R/Bb is being disabled, the program operation is carried out for one among pages included in one of the memory cell blocks B1~BK. As such, the program operation of the flash memory device 10 is prosecuted by one page in one time. Therefore, it needs to repeat the aforementioned procedure in order to complete the program operation for all of the memory cell blocks B1~BK, which causes the whole program time to be longer due to an increase of the number of the memory cell blocks.

In recent, in purpose of reducing the whole program time, the flash memory device adopts a cache program scheme. In the cache program scheme, a cache buffer preliminarily stores data to be programmed next and transfers the stored data to the page buffer in the program operation, so that the whole program time is shortened. Thus, it enhances the program speed of the flash memory device by the cache program scheme. On the other side, there have been recently proposed various multi-plane type flash memory devices including a plurality of planes in order to overcome the demerits of the single-type flash memory device having smaller data throughput relatively. The multi-plane type flash memory device is capable of having increased data throughput, but the whole program time therein increases because the plural planes are programmed in sequence. In other words, while one of the planes is being programmed in the unit of page, the remaining planes are not programmed. Therefore, there is a problem that the whole program time of the multi-plane type flash memory device is longer than the whole program time of the single-plane flash memory device. Furthermore, there is the cumbersome that it is required of selecting one of the planes and generating an address signal by an external memory controller in addition to a block address in order to program data in the selected plane or to read data from the selected plane. And, the flash memory device needs to comprise complicated control circuits to regulate the planes each by each.

SUMMARY OF THE INVENTION

The present invention relates to a flash memory device and improving an operation speed and data throughput by simultaneously conducting program and read operations for plural planes in response to a chip enable signal containing plural bits without the construction of complicated circuits.

One embodiment of the present invention is directed to provide a method of controlling program operations in a flash memory device, capable of improving an operation speed and data throughput by simultaneously conducting program operations for plural planes in response to a chip enable signal containing plural bits without the construction of complicated circuits.

One embodiment of the present invention is directed also to provide a method of controlling read operations in a flash memory device, capable of improving an operation speed and data throughput by simultaneously conducting read operations for plural planes in response to a chip enable signal containing plural bits without the construction of complicated circuits.

An aspect the present invention is to provide a flash memory device comprising: a plurality of planes each including a plurality of memory cell blocks; page buffers arranged in correspondence respectively with the plural planes, each latching an input data bit to be output to its corresponding plane or latching an output data bit to be received from the corresponding plane; cache buffers arranged in correspondence respectively with the page buffers, each storing the input data bit or the latched output data bit in response to one of cache input control signals and each transferring the stored data bit to the page buffer or an external device in response to one of cache output control signals; and a control logic circuit generating the cache input and output control signals in response to command and chip enable signals containing plural bits.

Another aspect of the present invention is to provide a method of controlling a program operation of a multi-plane type flash memory device. The method comprises the steps of: generating a program command in response to a command signal; storing input data bits into cache buffers arranged in correspondence with a plurality of planes; generating bias voltages for the program operation in response to the program command, selecting one of memory cell blocks of each of the plural planes ob basis of row and column address signals, and applying the bias voltages to the selected memory cell block; and outputting data bits stored in the cache buffers to the plural planes.

One embodiment of the present invention also provides a method of controlling a read operation of a multi-plane type flash memory device, comprising the steps of: generating a read command in response to a command signal; generating bias voltages for the read operation in response to the read command, selecting one of memory cell blocks of each of the plural planes on basis of row and column address signals, and applying the bias voltages to the selected memory cell block; storing output data bits of the plural planes simultaneously in cache buffers arranged in correspondence with the plural planes; and outputting data bits stored in the cache buffers to an external device one by one in sequence.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Figure 1:
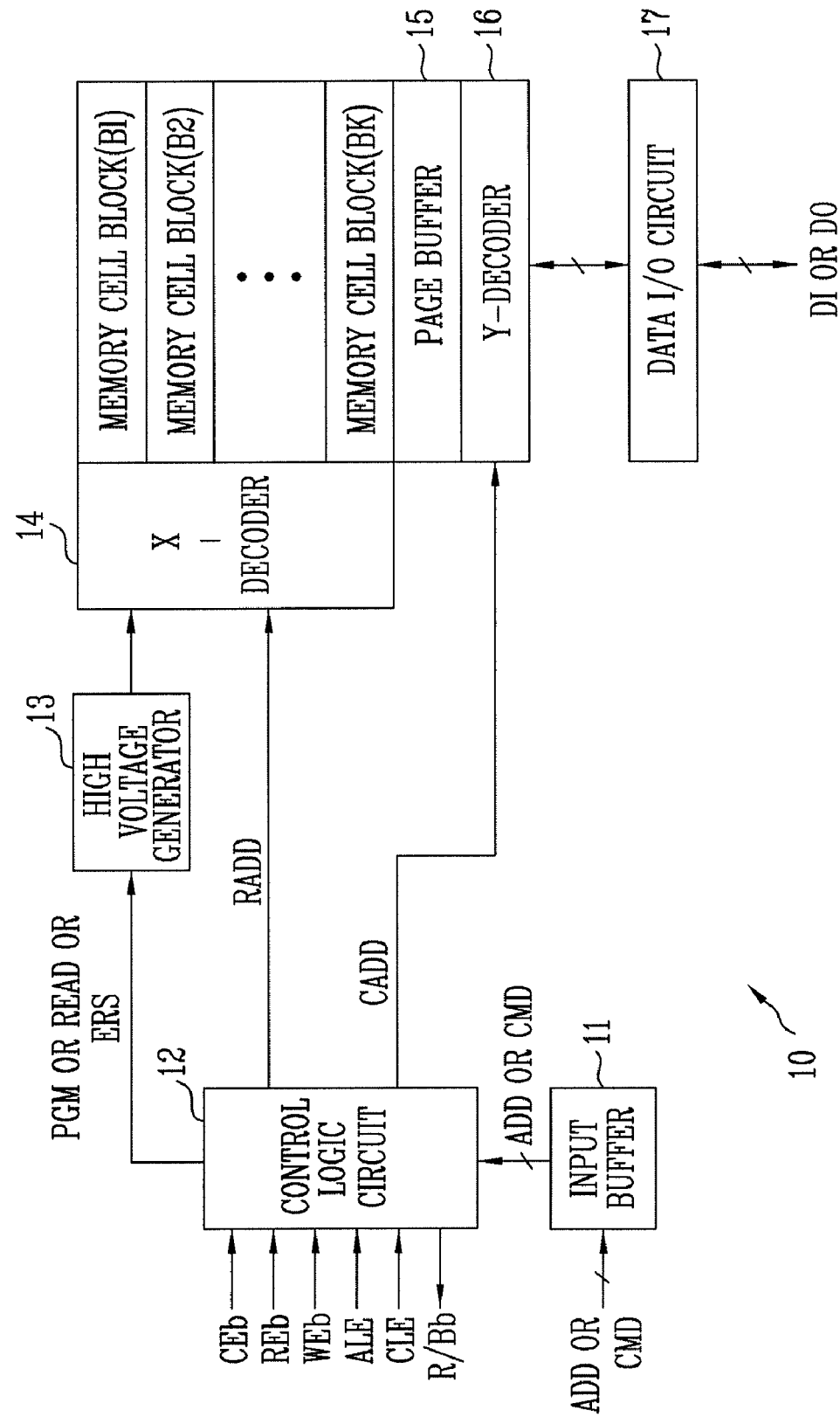
FIG. 1 is a block diagram of a conventional flash memory device.
Figure 2:
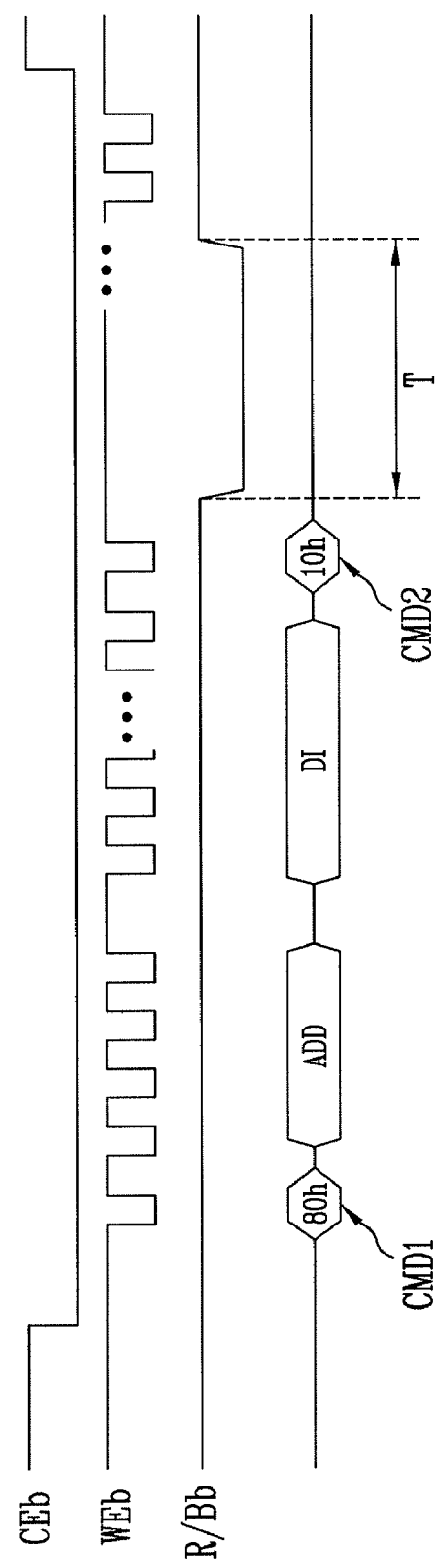
FIG. 2 is a timing diagram relevant to a program operation of the flash memory device shown in FIG. 1.
Figure 3:
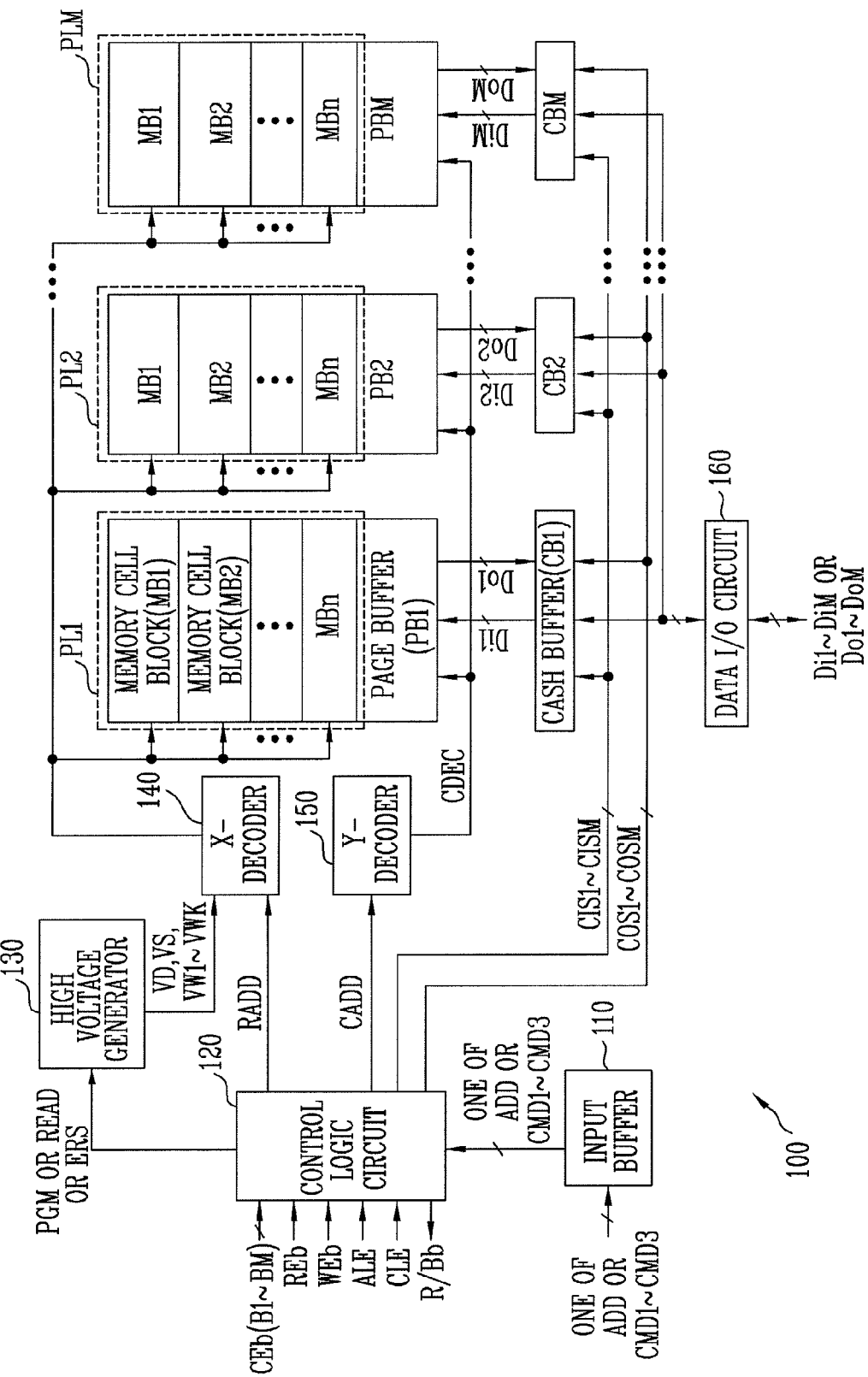
FIG. 3 is a block diagram of a conventional flash memory device.

FIG. 3 is a block diagram of a conventional flash memory device. Referring to FIG. 3, the flash memory device 100 is comprised of an input buffer 110, a control logic circuit 120, a high voltage generator 130, an X-decoder 140, a plurality of planes PL1~PLM (M is an integer), a plurality of page buffers PB1~PBM (M is an integer), a plurality of cache buffers CB1~CBM (M is an integer), and a data input/output circuit 160. The input buffer 110 receives and an external address signal ADD or a command signal (one of CMD1, CMD2, and CMD3), and then transfers the received signal to the control logic circuit 120. The control logic circuit 120 receives the command signal (one among CMD1, CMD2, and CMD3) or the external address signal ADD in response to the chip enable signal CEb and control signals REb, Web, ALE, and CLE. Preferably, the chip enable signal CEb contains bits B1~BM (M is an integer). The control logic circuit 120 generates one of a program command PGM, a read command READ, and an erasure command ERS in response to the command signal CMD1, CMD2, or CMD3. Preferably, the control logic circuit 120 generates the program command PGM in response to the command signal CMD1 containing a page program setup code (e.g., 80h). The control logic circuit 120 generates the read command PGM in response to the command signal CMD3 containing a read code (e.g., 00h or 01h). The control logic circuit 120 disables the ready/busy signal R/Bb for a predetermined time T4 (refer to FIG. 4), after generating the program command PGM, when receiving the command signal CMD2 including a confirmation code (e.g., 10h). As a result, an external control unit such as a memory controller (not shown) identifies the flash memory device 100 in the state of program operation by receiving the ready/busy signal R/Bb. Further, the control logic circuit 120 disables the ready/busy signal R/Bb for a predetermined time D2 (refer to FIG. 5), after generating the read command READ, when receiving the external address signal ADD. As a result, an external control unit such as a memory controller (not shown) identifies the flash memory device 100 in the state of read operation by receiving the ready/busy signal R/Bb.

The control logic circuit 120 generates cache input control signals CIS1~CISM (M is an integer) and cache output control signals COS1~COSM (M is an integer) in response to the command signals CMD1 and CMD2, and the bits B1~BM of the chip enable signal CEb. Describing in more detail, the control logic circuit 120 enables the cache input control signals CIS1~CISM by one in sequence for the predetermined time T2, after generating the program command PGM in response to the command signal CMD1, when the bits B1~BM change to their predetermined logic values one by one in sequence for the predetermined time T2 (refer to FIG. 4). For instance, the predetermined logic value may be established in '0'. The control logic circuit 120 enables the cache output control signals COS1~COSM by one in sequence for the predetermined time T4, after generating the program command PGM, when the bits B1~BM change to the predetermined logic value simultaneously for the predetermined time T4.

The control logic circuit 120, after generating the read command READ in response to the command signal CMD3, enables the cache output control signals COS1~COSM at the same time while the ready/busy R/Bb is being disabled. Preferably, when the control logic circuit 120 receives the command signal CMD3, the bits B1~BM are changed to the predetermined logic value and maintained therein while the ready/busy signal R/Bb is being disabled. The control logic circuit 120, after generating the read command READ, enables the cache output control signals COS1~COSM one by one in sequence for a predetermined time D3 when the bits B1~BM change into the predetermined logic value one by one in sequence for the predetermined time D3 (refer to D3).

The high voltage generator 130 outputs bias voltages VD, VS, and VW1~VWK (K is an integer) in response to the program command PGM, the read command READ, and the erasure command ERS. The VD is a voltage to be supplied to a drain selection line (not shown), the VS is a voltage to be supplied to a source selection line (not shown), and the VW1~VWK are voltages to be supplied to wordlines (nor shown). The X-decoder 140 selects one of the memory cell blocks MB1~MBn included in each of the plural planes PL1~PLM and supplies the bias voltages VD, VS, and VW1~VWK to the selected memory cell block, on basis of the row address signal RADD. Even not shown in FIG. 3, the X-decoder 140 decodes the row address signal RADD to generate row decoding signals, and selects one of the memory cell blocks MB1~MBn in each of the plural planes PL1~PLM on basis of the row decoding signals. The Y-decoder 150 decodes the column address signal CADD to generate column decoding signals CDEC and outputs the column decoding signals CDEC to the page buffers PB1~PBM.

The page buffers PB1~PBM are each arranged in the planes PL1~PLM, connected each to the cache buffers CB1~CBM. The page buffers PB1~PBM each latch input data Di1~DiM (M is an integer) received from the cache buffers CB1~CBM corresponding thereto, or select the bit-lines (not shown) of their corresponding planes PL1~PLM partially or wholly in response to the column decoding signals CDEC and then latch output data Do1~DoM (M is an integer) supplied from the selected bitlines. The page buffers PB1~PBM select the bitlines (nor shown) of their corresponding planes PL1~PLM partially or wholly, and transfers their latched data to the selected bitlines or to their corresponding cache buffers CB1~CBM, in response to the column decoding signals CDEC.

The cache buffers CB1~CBM store the input Di1~DiM received through the data input/output circuit 160 or store the output data Do1~DoM received from the page buffers PB1~PBM, in response to the cache input control signals CIS1~CISM respectively. Preferably, when the cache input control signals CIS1~CISM are enabled, the cache buffers CB1~CBM store the input data Di1~DiM or the output data Do1~DoM, respectively. Further, the cache buffers CB1~CBM output the data Di1~DiM or Do1~DoM, stored therein, to an external device through the page buffers PB1~PBM or the data input/output circuit 160, in response to the cache output control signals COS1~COSM. Preferably, the cache buffers CB1~CBM output their stored data Di1~DiM or Do1~DoM while the cache output control signals COS1~COSM are being enabled.

Figure 4:
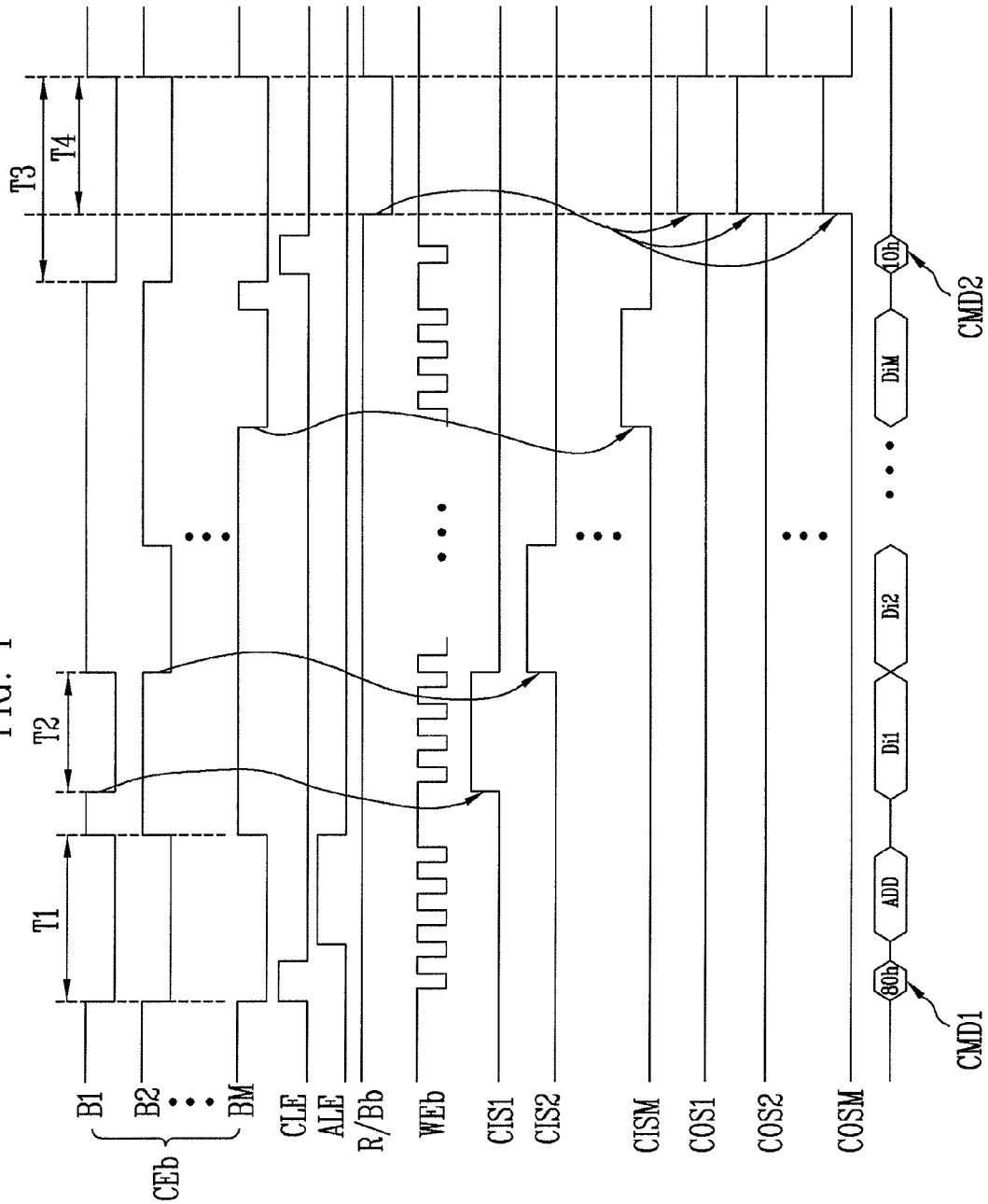
FIG. 4 is a timing diagram relevant to a program operation of the flash memory device shown in FIG. 3.

Then, it will be described about the program operation of the flash memory device 100 with reference to FIGS. 3 and 4. FIG. 4 is a timing diagram of signals relevant to the program operation of the flash memory device shown in FIG. 3. First, logic values of the bits B1~BM of the chip enable signal CEb are changed into logic '0' at the initial time. The control signals CLE and ALE are enabled in sequence and the control signal WEb is toggled. The control logic circuit 120 receives the command signal CMD1 and generates the program command PGM, in response to the control signals CLE and Web. And, the control logic circuit receives the external address signal ADD in response to the control signals ALE and WEb, and generates the row address signal RADD and the column address signal CADD on basis of the external address signal ADD.

After then, the logic values of the bits B1~BM are changed into logic '0' in sequence for the predetermined time T2. One of the logic values of the bits B1~BM is set on logic '0', the logic values of the rest bits are maintained in logic '1'.

The control logic circuit 120 enables the cache input control signals CIS1~CISM one by one in sequence for the predetermined time T2 in response to the bits B1~BM. For instance, the control logic circuit 120 enables the cache input control signal CIS1 for the predetermined time T2 when the bit B1 changes to logic '0'. The cache buffers CB1~CBM store the input data Di1~DiM one by one in sequence in response to the cache input control signals CIS1~CISM. For instance, the cache buffer CB1 stores the input data Di1 when the cache input control signal CIS1 is enabled. As like the cache buffer CB1, the other cache buffers CB2~CBM store the input data Di2~DiM, respectively, when the cache input control signals CIS2~CISM are enabled. After storing the input data Di1~DiM in all of the cache buffers CB1~CBM, the logic values of the bits B1~BM are simultaneously changed into logic '0' for the predetermined time T3. Further, the control logic circuit 120 receives the command signal CMD2 in response to the control signals CLE and Web, and disables the ready/busy signal R/Bb for the predetermined time T4 in response to the command signal CMD2. The logic control logic circuit 120 enables the cache output control signals COS1~COSM at the same time while the bits B1~BM changes to logic '0' and the ready/busy signal R/Bb is being disabled. Responding to the cache output control signals COS1~COSM, the cache buffers CB1~CBM output the input data Di1~DiM, that are stored therein, to the page buffers PB1~PBM, respectively, at the same time. As a result, the page buffers PB1~PBM latch the input data Di1~DiM, respectively.

The high voltage generator 130 outputs bias voltages VD, VS, and VW1~VWK in response to the program command PGM. The X-decoder 140 selects one of the memory cell blocks MB1~MBn included in each of the planes PL1~PLM, on basis of the row address signal RADD. For example, when the X-decoder 140 selects the memory cell blocks MB1s in each of the planes PL1~PLM, it supplies the bias voltage VD, VS, and VW1~VWM to the memory cell blocks MB1s of the planes PL1~PLM. The Y-decoder 150 decodes the column address signal CADD and outputs the column decoding signal CDEC to the page buffers PB1~PBM. The page buffers PB1~PBM select the bitlines of each of the planes PL1~PLM partially or entirely in response to the column decoding signal CDEC, and then output the latched input data Di1~DiM to the selected bitlines. As a result, the pages corresponding to the row address signal RADD of the memory cell blocks MB1s of the planes PL1~PLM are programmed at the same time.

Figure 5:
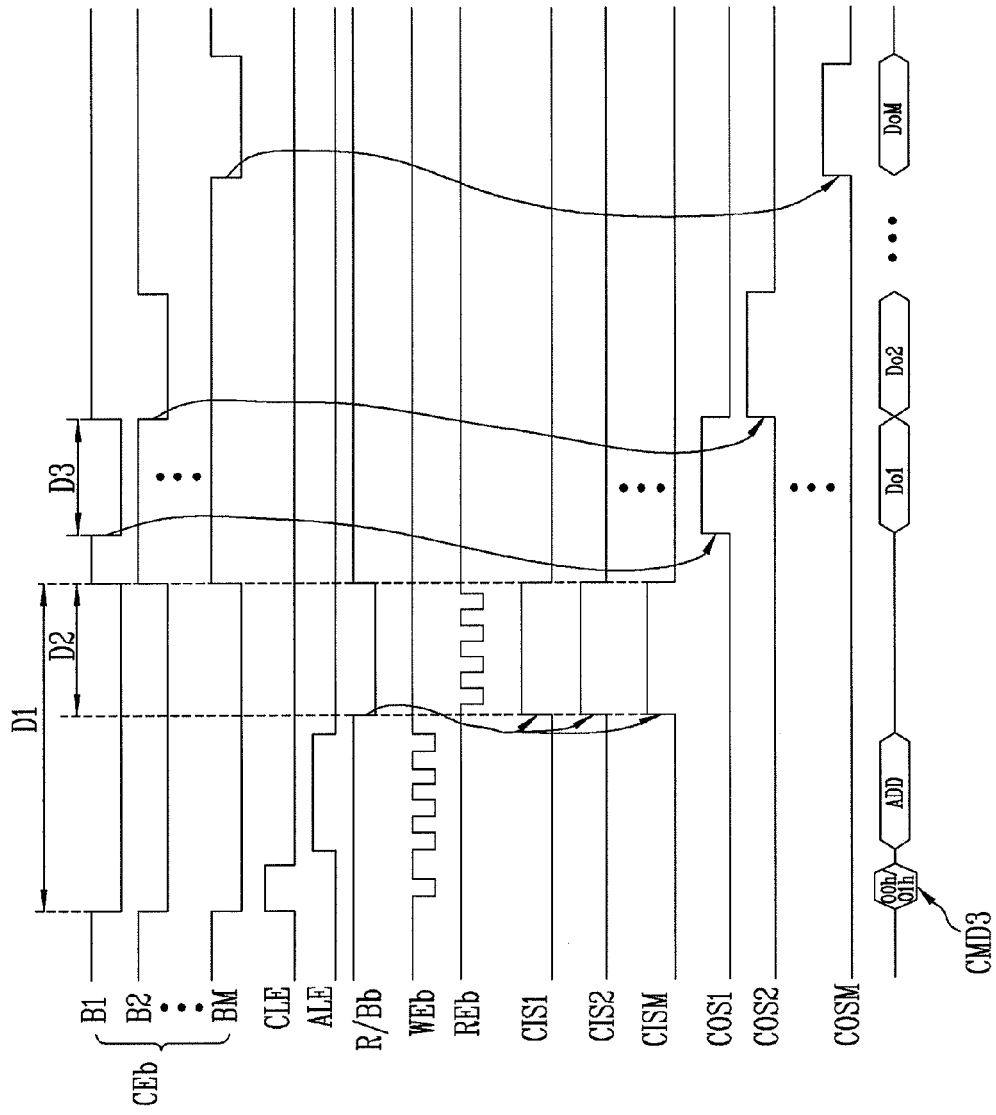
FIG. 5 is a timing diagram relevant to a read operation of the flash memory device shown in FIG. 3.

Next, it will be described about the read operation of the flash memory device 100 with reference to FIGS. 3 and 5. FIG. 5 is a timing diagram of signals relevant to the read operation of the flash memory device shown in FIG. 3. Referring to FIG. 5, first, logic values of the bits B1~BM of the chip enable signal CEb are changed into logic '0' for a predetermined time D1 at the initial. The control signals CLE and ALE are enabled in sequence and the control signal WEb is toggled. The control logic circuit 120 receives the command signal CMD3 and generates the read command READ, in response to the control signals CLE and WEb. And, the control logic circuit 120 receives the external address signal ADD in response to the control signals ALE and Web, and generates the row address signal RADD and the column address signal CADD on basis of the external address signal ADD.

The high voltage generator 130 outputs bias voltages VD, VS, and VW1~VWK in response to the read command READ. The X-decoder 140 selects one of the memory cell blocks MB1~MBn included in each of the planes PL1~PLM, on basis of the row address signal RADD. For example, when the X-decoder 140 selects the memory cell blocks MB2s in each of the planes PL1~PLM, it supplies the bias voltage VD, VS, and VW1~VWM to the memory cell blocks MB2s of the planes PL1~PLM. The Y-decoder 150 decodes the column address signal CADD and outputs the column decoding signal CDEC to the page buffers PB1~PBM. The page buffers PB1~PBM select the bitlines of each of the planes PL1~PLM partially or entirely in response to the column decoding signal CDEC, and then latch the output data Do1~DoM received from the selected bitlines. As a result, the pages buffers latch the output data Do1~DoM of pages corresponding to the row address signal RADD of the memory cell blocks MB2s of the planes PL1~PLM. Thus, data of the pages corresponding to the row address signal RADD of the memory cell blocks MB2s of the planes PL1~PLM are read at the same time.

On the other hand, the control logic circuit 120, when the external address signal ADD is received, disables the ready/busy signal R/Bb for a predetermined time D2. During this, the control signal REb is toggling. The logic control logic circuit 120 enables the cache input control signals CIS1~CISM at the same time while the ready/busy signal R/Bb is being disabled. As a result, the page buffers PB1~PBM store the latched output data Do1~DoM, respectively, in response to the cache input control signals CIS1~CISM.

Thereafter, the logic values of the bits B1~BM are changed into logic '0' each by each in sequence for a predetermined time D3. When one of the bits B1~BM is set on logic '0', the logic values of the rest bits are maintained in logic '1'.

The control logic circuit 120 disables the cache output control signals COS1~COSM one by one in sequence for the predetermined time D3 in response to the bits B1~BM. For instance, the control logic circuit 120 enables the cache output control signal COS1 for the predetermined time D3 when the bit B1 changes to logic '0'. The cache buffers CB1~CBM output the their stored output data Do1~DoM through the data input/output circuit 160 one by one in sequence in response to the cache output control signals COS1~COSM. As a result, the output data Do1~DoM are sequentially output from the data input/output circuit 160 in sequence.

Figure 6:
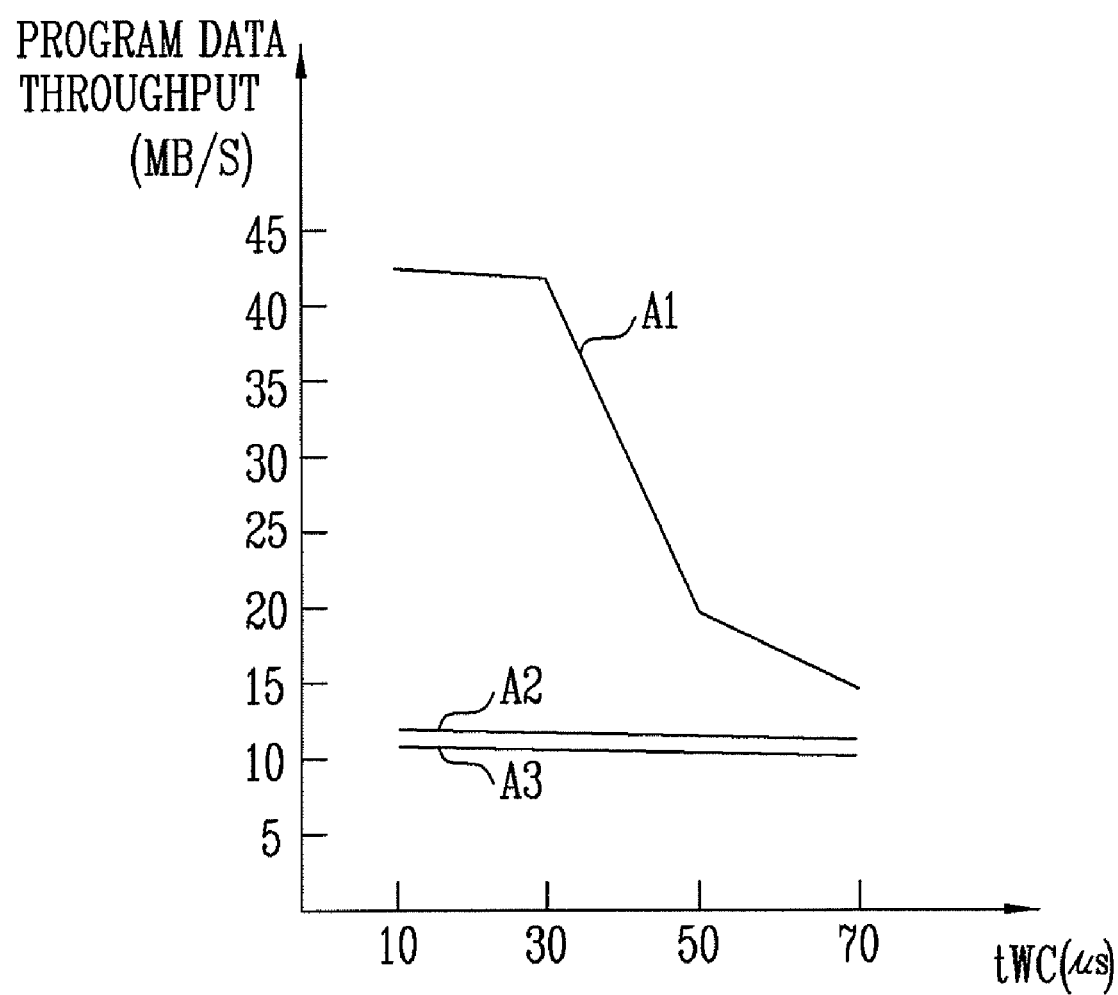
FIG. 6 is a graphic diagram comparatively illustrating data throughput processed by the program operation of the present flash memory device and by a program operation of a single-plane type flash memory device.

FIG. 6 is a graphic diagram comparatively illustrating data throughput processed by the program operation of the present flash memory device and by a program operation of a single-plane type flash memory device. A curve A1 plots the data throughput by the program operation of the flash memory device according to the present invention. A curve A2 plots the data throughput by the program operation of the single-plane type flash memory device including a cache buffer. And, a curve A3 plots the data throughput by the program operation of the single-plane type flash memory device without the cache buffer. The curves A1, A2, and A3 represent the features of data throughput in the condition that a program time tPROG is 200 µs. As illustrated in FIG. 6, it can be seen that the data throughput T1 of the flash memory device according to the present invention is much larger than the data throughputs of the single-plane type flash memory devices. In more detail, the following Equation 1 summarizes the data throughput T1 by the program operation of the flash memory device according to the present invention and the data throughput T2 by the program operation of the single-plane type flash memory device without the cache buffer.

$$T1 = \frac{4M}{tDIN_S 4M + tPROG_S \frac{M}{4}} \quad \text{[Equation 1]}$$

$$(\text{but}, \ tDIN_S 4M < tPROG)$$

$$T1 = \frac{4M}{tDIN_S 4M + tPROG_S \frac{M}{4}}$$

where, M is the whole number of pages, tDIN is tWC (write cycle time) of a page, and tPROG is a program time.

As referred to Equation 1, the data throughput by the program operation of the flash memory device according to the present invention is larger than the data throughput T2 by the program operation of the single-plane type flash memory device.

As described above, the present invention is able to improve an operation speed and data throughput by simultaneously conducting program and read operations for plural planes in response to a chip enable signal containing plural bits without the construction of complicated circuits.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A flash memory device comprising:
   a control logic circuit to generate cache input control signals and cache output control signals, the control logic circuit receiving a chip enable signal having a plurality of bit signals, wherein:
   the cache input control signals correspond to the bit signals,
   each cache input control signal is generated when corresponding bit signals are at a low level,
   the control logic circuit receives addresses when an address latch enable signal is enabled, the latch enable signal being enabled when the bit signals are at a low level,
   the cache input control signals are generated in sequence during a program operation and are simultaneously generated during a read operation, and
   the cache output control signals are simultaneously generated in the program operation and are generated in sequence in the read operation;
   a plurality of planes each including a plurality of memory cell blocks, wherein:
   the number of planes corresponds to the number of bit signals of the chip enable signal, and
   in the program operation, data is simultaneously programmed in each of the plurality of planes;
   a plurality of page buffers, each page buffer connected to a corresponding one of the planes, each page buffer simultaneously latching an input data bit to be output to its corresponding plane and simultaneously latching an output data bit received from the corresponding plane; and
   a plurality of cache buffers, each cache buffer connected to a corresponding one of the page buffers and the corresponding plane, wherein:
   in the read operation, the data programmed in the plurality of planes is simultaneously output to the plurality of cache buffers based on the cache output control signals,
   the cache buffers store in sequence the input data bits in response to the cache input control signals in the program operation and simultaneously store the latched output data bits in response to the cache input control signals in the read operation, and
   the cache buffers simultaneously transfer the stored data bits to the corresponding page buffers in response to the cache output control signals in the program operation and transfer the stored data bits in sequence to an external device in response to the cache output control signals in the read operation.

2. The flash memory device as set forth in claim 1, wherein the control logic circuit generates one among a program command, a read command, and an erase command in response to the command signal, and generates row and column address signals in response to an external address signal.

3. The flash memory device as set forth in claim 1, wherein the number of the bit signals of the chip enable signal is identical to the number of the planes.

4. The flash memory device as set forth in claim 2, further comprising:
 a high voltage generator generating bias voltages in response to one among the program voltage, the read command, and the erase command;
 an X-decoder selecting one of the memory cell blocks included in each of the planes on basis of the row address signal and supplying the bias voltages to the selected memory cell block; and
 a Y-decoder decoding the column address signal and applying the column address signal to the page buffers,
 wherein the page buffers select bitlines of corresponding planes partially or entirely in response to the column decoding signal, output the input data bits to the selected bitlines, and latch the output data bits received from the selected bitlines.

5. The flash memory device as set forth in claim 2, wherein the control logic circuit generates the program command when the command signal contains a page program setup code, and disables a ready/busy signal for a first predetermined time when receiving the command signal containing a confirmation code after generating the program command.

6. The flash memory device as set forth in claim 5, wherein the control logic circuit, after generating the program command, enables the cache input control signals one by one in sequence for a second predetermined time when the bit signals are changed into a predetermined logic value one by one in sequence for the second predetermined time, and enables the cache output control signals at the same time while the ready/busy signal is being disabled when the bit signals are changed into the predetermined logic value at the same time for the first predetermined time, and
 wherein the cache buffers store the input data bits one by one in sequence when the cache input control signals are enabled one by one in sequence, and outputs the stored data bits to the page buffers at the same time when the cache output control signals are enabled at the same time.

7. The flash memory device as set forth in claim 6, wherein after storing the input data bits stored in the last one of the cache buffers, the bit signals are changed to the predetermined logic value at the same time for the first predetermined time.

8. The flash memory device as set forth in claim 2, wherein the control logic circuit generates the read command when the command signal contains a read code, and disables a ready/busy signal for a first predetermined time when the external address signal is received after generating the read command.

9. The flash memory device as set forth in claim 8, wherein the control logic circuit, after generating the read command, enables the cache input control signals at the same time while the ready/busy signal is being disabled, and enables the cache output control signals one by one in sequence for a second predetermined time when the bit signals are changed into a predetermined logic value one by one in sequence for the second predetermined time, and
 wherein the cache buffers store the latched output data bits received from the page buffers when the cache input control signals are enabled at the same time, and output the stored data bits to the external device one by one in sequence when the cache output control signals are enabled one by one in sequence.

10. The flash memory device as set forth in claim 9, wherein the bit signals are changed into the predetermined logic value when the control logic circuit receives the command signal, being maintained in the predetermined logic value when the ready/busy signal is being disabled.

11. The flash memory device as set forth in claim 9, wherein the bit signals are changed into the predetermined logic value one by one in sequence for the second predetermined time after the latched output data bits are sequentially stored in the cache buffers.

12. A method of controlling a program operation of a flash memory device that includes a plurality of planes, each of the planes including a plurality of memory cell blocks, the method comprising:
 generating a program command in response to a command signal;
 receiving a chip enable signal having a plurality of bit signals, the bit signals having a one to one correspondence with the planes;
 receiving addresses when an address latch enable signal is enabled, wherein the address latch enable signal is enabled when the bit signals are at a low level;
 storing input data bits into cache buffers arranged in correspondence with a plurality of planes, wherein:
  each plane comprises a plurality of memory blocks, and
  the cache buffers operate in sequence in response to cache input control signals which are enabled in sequence in the program operation;
 generating bias voltages for the program operation in response to the program command;
 selecting one of the memory cell blocks of each of the planes according to row and column address signals which are generated by the addresses;
 applying the bias voltages to the selected memory cell blocks;
 simultaneously outputting data bits stored in the cache buffers to page buffers of the planes in response to cache output control signals which are simultaneously enabled in the program operation; and
 simultaneously programming the data bits from the page buffers to the selected memory cell blocks.

13. The method as set forth in claim 12, wherein the storing-input-data-bits step comprises:
 enabling the cache input control signals one by one in sequence for a predetermined time in response to the bit signals of the chip enable signal;
 storing the input data bits in a corresponding one of the cache buffers in response to one of the cache input control signals; and
 repeating the enabling-cache-input-control-signals step and storing-the-input-data-bits step until the input data bits are stored up to the last one of the cache buffers.

14. The method as set forth in claim 13, wherein the enabling step comprises:
 changing the bit signals of the chip enable signal into a predetermined logic value one by one in sequence for the predetermined time after generation of the program command.

15. The method as set forth in claim 13, wherein the storing-input-data-bits step further comprises:
 changing the bit signals of the chip enable signal into a predetermined logic value simultaneously for a predetermined time after the input data bits are stored up to the last one of the cache buffers.

16. The method as set forth in claim 12, wherein the outputting step comprises:
    enabling cache output control signals simultaneously, when the bit signals of the chip enable signal are changed into a predetermined logic value simultaneously for a first predetermined time and for a second predetermined time after generation of the program command;
    outputting data bits stored in the cache buffers to the page buffers that are each coupled to at least one of the cache buffers and arranged in correspondence with the plurality of planes, in response to the cache output control signals; and
    latching the stored data bits in the page buffers and outputting the latched data bits each to the plurality of planes.

17. A method of controlling a read operation of a flash memory device that includes a plurality of planes, each of the planes including a plurality of memory cell blocks, the method comprising:
    generating a read command in response to a command signal;
    receiving a chip enable signal having a plurality of bit signals, the bit signals having a one to one correspondence with the planes;
    receiving addresses when to an address latch enable signal is enabled, wherein the address latch enable signal is enabled when the bit signals are at a low level;
    generating bias voltages for the read operation in response to the read command;
    applying the bias voltages to selected memory cell blocks;
    simultaneously outputting data bits programmed in the selected memory cell blocks of the planes;
    storing the output data bits of the planes simultaneously in cache buffers arranged in correspondence with the planes in response to cache input control signals which are simultaneously enabled during the read operation; and
    outputting the data bits stored in the cache buffers to an external device one by one in sequence in response to cache output control signals which are enabled in sequence during the read operation.

18. The method as set forth in claim 17, wherein the storing step comprises:
    latching the output data bits in page buffers arranged in correspondence with the planes;
    enabling cache input control signals at the same time when a ready/busy signal is disabled after generation of the read command; and
    storing the latched data bits simultaneously in the cache buffers coupled to the page buffers in response to the cache input control signals.

19. The method as set forth in claim 18, wherein the enabling step comprises:
    changing the bit signals of the chip enable signal simultaneously into a predetermined logic value when the read command is generated and maintaining the bit signals at the predetermined logic value while the ready/busy signal is being disabled.

20. The method as set forth in claim 17, wherein the outputting step comprises:
    enabling the cache output control signals one by one in sequence for a predetermined time in response to the bit signals of a chip enable signal;
    outputting the data bit stored in a corresponding one of the cache buffers, to the external device in response to an enabled one of the cache output control signals; and
    repeating the enabling-cache-output-control-signals step and outputting step until the data bit stored in the last one of the cache buffers is output to the external device.

21. The method as set forth in claim 20, wherein the enabling step comprises:
    changing the bit signals of the chip enable signal into a predetermined logic value one by one in sequence for the predetermined time after the output data bits are simultaneously stored in the cache buffers.

* * * * *